United States Patent
Kruest et al.

(10) Patent No.: US 10,133,894 B2
(45) Date of Patent: *Nov. 20, 2018

(54) SYSTEMS AND METHODS FOR STIRRING ELECTROMAGNETIC FIELDS AND INTERROGATING STATIONARY RFID TAGS

(75) Inventors: James Robert Kruest, San Diego, CA (US); Gary Bann, San Diego, CA (US)

(73) Assignee: SMARTAC TECHNOLOGY FLETCHER, INC., Fletcher, NC (US)

( * ) Notice: Subject to any disclaimer, the term of this patent is extended or adjusted under 35 U.S.C. 154(b) by 995 days.

This patent is subject to a terminal disclaimer.

(21) Appl. No.: 12/982,398

(22) Filed: Dec. 30, 2010

(65) Prior Publication Data
US 2011/0163849 A1 Jul. 7, 2011

Related U.S. Application Data

(62) Division of application No. 11/766,752, filed on Jun. 21, 2007, now Pat. No. 7,884,725.

(Continued)

(51) Int. Cl.
*G08B 13/14* (2006.01)
*G05B 11/01* (2006.01)
(Continued)

(52) U.S. Cl.
CPC ....... *G06K 7/10475* (2013.01); *G06K 7/0008* (2013.01); *G06K 7/10029* (2013.01);
(Continued)

(58) Field of Classification Search
CPC ........... G06K 7/0008; G06K 19/07796; G06K 2017/0045; G06K 19/0723; G06Q 10/08;
(Continued)

(56) References Cited

U.S. PATENT DOCUMENTS 4,660,127 A   4/1987   Gunter
5,117,746 A * 6/1992   Sharp .............................. 454/61
(Continued)

FOREIGN PATENT DOCUMENTS

GB    2328839 A    1/2014
JP    2006140611 A * 6/2006
(Continued)

OTHER PUBLICATIONS

Young, Lee W., Authorized Officer, in Application PCT/US07/71823, in International Search Report and Written Opinion, dated Feb. 14, 2008, 9 pages.

*Primary Examiner* — Steven Lim
*Assistant Examiner* — Muhammad Adnan
(74) *Attorney, Agent, or Firm* — Procopio

(57) ABSTRACT

RFID tags are used for many purpose including tracking RFID interrogators are used to retrieve information from tags. In many applications, RFID interrogators and RFID tags remain stationary during interrogation. Regions of low energy due to interference from either additional antenna or reflections from RFID tags and objects can impede or prohibit the reading of RFID tags residing in such regions. Stirring of the generated electromagnetic field is a method of moving around the regions of low energy, where tags can not be read, during the interrogation process. Mechanical stirring is accomplished by introducing a conductor into the electromagnetic field and moving it about in the field. Solid state stirring is accomplished by introducing a variable conductor into the field and varying the conductivity of the variable conductor. Mathematical stirring is accomplished by use of a plurality of antenna and controlling the phase difference between the antenna in a configuration known as phased antenna arrays.

14 Claims, 7 Drawing Sheets

Related U.S. Application Data

(60) Provisional application No. 60/805,423, filed on Jun. 21, 2006.

(51) Int. Cl.

| | |
|---|---|
| *H04Q 5/22* | (2006.01) |
| *G08C 19/12* | (2006.01) |
| *G08C 19/16* | (2006.01) |
| *G06K 7/10* | (2006.01) |
| *H04J 3/06* | (2006.01) |
| *G06K 7/00* | (2006.01) |
| *G06K 19/077* | (2006.01) |
| *G06K 19/07* | (2006.01) |
| *G06Q 10/08* | (2012.01) |
| *H05K 1/02* | (2006.01) |
| *H05K 1/14* | (2006.01) |
| *H05K 3/30* | (2006.01) |

(52) U.S. Cl.
CPC ..... *G06K 7/10039* (2013.01); *G06K 19/0723* (2013.01); *G06K 19/07796* (2013.01); *G06K 19/07798* (2013.01); *G06Q 10/08* (2013.01); *H04J 3/0641* (2013.01); *H05K 1/02* (2013.01); *H05K 1/0266* (2013.01); *H05K 1/0268* (2013.01); *H05K 1/142* (2013.01); *H05K 3/30* (2013.01); *H05K 2201/0909* (2013.01); *H05K 2201/09127* (2013.01)

(58) Field of Classification Search
CPC ............ G08B 13/2417; G08B 13/2462; G08B 13/242
USPC ............................................. 340/572.1–572.9
See application file for complete search history.

(56) References Cited

U.S. PATENT DOCUMENTS

| | | | |
|---|---|---|---|
| 5,751,220 A | 5/1998 | Ghaffari et al. | |
| 5,942,977 A | 8/1999 | Palmer et al. | |
| 6,060,992 A | 5/2000 | Huang et al. | |
| 6,118,379 A | 9/2000 | Kodukula et al. | |
| 6,259,353 B1 | 7/2001 | Berger et al. | |
| 6,330,971 B1 | 12/2001 | Mabry et al. | |
| 6,538,564 B1 | 3/2003 | Cole | |
| 6,563,425 B2 | 5/2003 | Nicholson et al. | |
| 6,643,801 B1 | 11/2003 | Jammu et al. | |
| 6,720,930 B2 * | 4/2004 | Johnson et al. | 343/742 |
| 6,724,308 B2 | 4/2004 | Nicholson | |
| 6,750,771 B1 * | 6/2004 | Brand | 340/572.7 |
| 6,812,838 B1 | 11/2004 | Maloney | |
| 6,983,033 B1 * | 1/2006 | Jenkins | 377/6 |
| 6,989,796 B2 | 1/2006 | Rahim | |
| 7,075,435 B2 | 7/2006 | Jesser | |
| 7,176,799 B1 | 2/2007 | Golicz et al. | |
| 7,183,922 B2 * | 2/2007 | Mendolia et al. | 340/572.1 |
| 7,317,396 B2 * | 1/2008 | Ujino | G11B 20/00086 340/10.1 |
| 7,339,120 B2 | 3/2008 | Notohara et al. | |
| 7,342,499 B2 | 3/2008 | Chiu et al. | |
| 7,391,325 B2 | 6/2008 | Cobianu et al. | |
| 7,432,816 B1 | 10/2008 | Ku et al. | |
| 7,701,351 B2 * | 4/2010 | Kawai et al. | 340/572.7 |
| 7,884,725 B2 * | 2/2011 | Kruest | G06K 7/0008 340/572.7 |
| 7,893,833 B2 | 2/2011 | Shachar | |
| 7,938,335 B2 * | 5/2011 | Jesme | G06K 19/07749 235/375 |
| 7,969,282 B2 | 6/2011 | Powell et al. | |
| 8,098,134 B2 | 1/2012 | Azevedo et al. | |
| 8,179,265 B2 | 5/2012 | Elizondo et al. | |
| 8,451,095 B2 | 5/2013 | Azevedo et al. | |
| 8,610,580 B2 | 12/2013 | Elizondo et al. | |
| 2002/0048462 A1 | 4/2002 | Weinberger et al. | |
| 2002/0109636 A1 * | 8/2002 | Johnson et al. | 343/742 |
| 2002/0123251 A1 | 9/2002 | Yatskov et al. | |
| 2002/0196126 A1 | 12/2002 | Eisenberg et al. | |
| 2004/0046663 A1 | 3/2004 | Jesser | |
| 2004/0070953 A1 | 4/2004 | Schulz et al. | |
| 2004/0085192 A1 * | 5/2004 | Hartmann | 340/10.4 |
| 2004/0150521 A1 | 8/2004 | Stilp | |
| 2004/0212542 A1 * | 10/2004 | Rahim | 343/742 |
| 2005/0077353 A1 * | 4/2005 | Oishi et al. | 235/385 |
| 2005/0110641 A1 | 5/2005 | Mendolia et al. | |
| 2005/0186902 A1 | 8/2005 | Lieffort et al. | |
| 2005/0242953 A1 | 11/2005 | Nakagawa et al. | |
| 2005/0248455 A1 | 11/2005 | Pope et al. | |
| 2005/0258956 A1 * | 11/2005 | Neuwirth | G06Q 10/08 340/539.13 |
| 2006/0001585 A1 * | 1/2006 | Saito et al. | 343/754 |
| 2006/0012465 A1 | 1/2006 | Lee | |
| 2006/0055539 A1 | 3/2006 | Lawrence et al. | |
| 2006/0145864 A1 | 7/2006 | Jacober et al. | |
| 2006/0158311 A1 * | 7/2006 | Hall et al. | 340/10.2 |
| 2006/0176152 A1 | 8/2006 | Wagner et al. | |
| 2006/0223340 A1 | 10/2006 | Yoneda | |
| 2007/0096911 A1 * | 5/2007 | Gualtieri | 340/572.2 |
| 2007/0171071 A1 | 7/2007 | Chiu et al. | |
| 2007/0173970 A1 | 7/2007 | Shachar | |
| 2007/0279233 A1 | 12/2007 | Ryckman | |
| 2008/0024273 A1 | 1/2008 | Kruest et al. | |
| 2008/0055094 A1 * | 3/2008 | Barber et al. | 340/573.2 |
| 2008/0315992 A1 | 12/2008 | Forster | |
| 2009/0079568 A1 | 3/2009 | Forster et al. | |
| 2011/0050426 A1 | 3/2011 | Choong | |
| 2011/0163849 A1 | 7/2011 | Kruest et al. | |

FOREIGN PATENT DOCUMENTS

| | | | |
|---|---|---|---|
| JP | 2009250849 A | * | 10/2009 |
| MX | 297024 | | 3/2012 |

* cited by examiner

SYSTEMS AND METHODS FOR STIRRING ELECTROMAGNETIC FIELDS AND INTERROGATING STATIONARY RFID TAGS

RELATED APPLICATIONS INFORMATION

This application claims priority as a divisional under 35 U.S.C. 120 to U.S. patent application Ser. No. 11/766,752, filed Jun. 21, 2007, and entitled "Systems and Methods for Stirring Electromagnetic Fields and Interrogating Stationary RFID Tags," which in turn claims priority under 35 U.S.C. 119(e) to Provisional Patent Application Ser. No. 60/805,423, filed Jun. 21, 2006, and entitled "An RFID Smart Cabinet and a Multi-Document Read Write Station," both of which are incorporated herein by reference as if set forth in full.

BACKGROUND

1. Field of the Invention

The field of the invention relates generally to Radio Frequency Identification (RFID) systems and more particularly to systems and methods for reading and writing information from multiple RFID enabled documents.

2. Background of the Invention

FIG. 1 illustrates a basic RFID system 100, A basic RFID system 100 comprises three main components: an antenna or coil 104; an interrogator 102, and a transponder, or RF tag 106 which is often electronically programmed with unique information. Antenna 104 can be configured to emit radio signals 108 to activate tag 106 and read and write data from the activated tag 106. Antenna 104 is the conduit between tag 106 and interrogator 102, which is typically configured to control data acquisition and communication. Antennas 104 are available in a variety of shapes and size. For example, in certain embodiments they can be built into a door frame to receive tag data from persons or things passing through the door. In other embodiments, antennas 104 can, for example, be mounted on an interstate toll booth to monitor traffic passing by on a freeway. Further, depending on the embodiments, the electromagnetic field, i.e., radio signal 108, produced by an antenna 104 can be constantly present when, e.g., multiple tags 106 are expected continually. If constant interrogation is not required, then radio signal 108 can, for example, be activated by a sensor device.

Often antenna 104 is packaged with interrogator 102. A conventional interrogator 102 can emit radio signals 108 in ranges of anywhere from one inch to 100 feet or more, depending upon the power output and the radio frequency used. When an RFID tag 106 passes through an electromagnetic zone associated with radio signal 108, it detects radio signal 108, which can comprise an activation signal. In some embodiments, interrogators can comprise multiple antenna, though typically only one transmits at a time.

Additionally, interrogator 102 is often coupled through network 112 to a central server 112. Central server 112 can be configured to execute a number of applications including those which incorporate data from an RFID tags. For example, in a tracking system, interrogator 102 transmits to the central server 112 the identity of tags which pass through its interrogation zone. This information can be correlated to objects associated with the tag in a database residing on the central server and hence the whereabouts of the object in question at that particular time can be logged. In the example of a toll booth, tags that pass through the specific toll both are reported to central server 112 which correlates the tag to a motorist who is then debited the cost of the toll.

RFID tags 106 come in a wide variety of shapes and sizes. Animal tracking tags, for example, inserted beneath the skin, can be as small as a pencil lead in diameter and one-half inch in length. Tags 106 can be screw-shaped to identify trees or wooden items, or credit-card shaped for use in access applications. Anti-theft hard plastic tags attached to merchandise in stores can include RFID tags. In addition, heavy-duty RFID tags can be used to track intermodal containers, heavy machinery, trucks, and/or railroad cars for maintenance and/or tracking purposes.

RFID tags 106 are categorized as either active or passive. Active RFID tags 106 are powered by an internal battery and are typically read/write, i.e., tag data can be rewritten and/or modified. An active tag's memory size varies according to application requirements. For example, some systems operate with up to 1 MB of memory. In a typical read/write RFID work-in-process system, a tag 106 might give a machine a set of instructions, and the machine would then report its performance to tag 106. This encoded data would then become part of the tagged part's history. The battery-supplied power of an active tag 106 generally gives it a longer read range. The trade off is greater size, greater cost, and a limited operational life.

Passive RFID tags 106 operate without a separate external power source and obtain operating power generated from radio signal 108. Passive tags 106 are consequently much lighter than active tags 106, less expensive, and offer a virtually unlimited operational lifetime. The trade off is that they have shorter read ranges than active tags 106 and require a higher-powered interrogator 102. Read-only tags 106 are typically passive and are programmed with a unique set of data, usually 32 to 128 bits, that cannot be modified. Read-only tags 106 often operate as a license plate into a database, in the same way as linear barcodes reference a database containing modifiable product-specific information.

RFID systems are also distinguishable by their frequency ranges. Low-frequency, e.g., 30 KHz to 500 KHz, systems 100 have short reading ranges and lower system costs. They are commonly used in security access, asset tracking, and animal identification applications. High-frequency, e.g., 850 MHz to 950 MHz and 2.4 GHz to 2.5 GHz 100 systems offer long read ranges, e.g., greater than 90 feet, high reading speeds, and are used for such applications as railroad car tracking and automated toll collection, however, the higher performance of high-frequency RFID systems 100 incurs higher system costs.

The significant advantage of all types of RFID systems 100 is the noncontact, non-line-of-sight nature of the technology. Tags 106 can be read through a variety of substances such as snow, fog, ice, paint, crusted grime, and other visually and environmentally challenging conditions, where barcodes or other optically read technologies cannot typically be used. RFID tags 106 can also be read in challenging circumstances at high speeds, often responding in less than 100 milliseconds. RFID has become indispensable for a wide range of automated data collection and identification applications that would not be possible otherwise In other RFID systems the tags can remain relatively stationary. For example, in a warehouse tracking application, a forklift can be equipped with an RFID interrogator, whose position and other motion information can be determined by reading RFID tags on the floor of the warehouse. In this application, the RFID tags are permanently affixed to the floor of the warehouse deployed in a known arrangement where the position of the tags are known ahead of time.

In a shipment tracking application, a handheld RFID interrogator can be passed over a package to read an RFID tag. Typically, the operator can scan a package's RFID tag 106 by passing the interrogator 102 with the antenna 108 mounted on it or just the antenna 108 near the RFID tag 106. Though the package can be mobile as well, the interrogator 102 or its antenna 108 are easily moved by the operator.

Still other RFID systems can have both stationary RFID tags 102 interrogated by stationary interrogators 102. For example, in a medical inventory system, medication in containers with RFID tags 106 affixed to them are placed inside a cabinet or drawer. When the cabinet is closed or locked, an RFID interrogator 102 takes an inventory of the contents of the cabinet. A central server 112 can compare the results of this inventory to that of the inventory prior to the opening of the door, which yields a list of medication that was either added or removed from the cabinet. Such a system can be used to insure that the proper medication for a specific patient is removed for use.

An additional challenge in RFID interrogation arises when used in an environment where both the antenna and the RFID tags are stationary. In normal transmission of electromagnetic energy, reflections from objects, RFID tags can cause destructive interference leading to regions in the electromagnetic fields with either little or no energy. In addition, in systems where multiple antenna are used either by the same interrogator or by a second interrogator. The electromagnetic fields generated by these antennae can also destructively interfere leading to regions of little or no energy. In RFID applications where the tags are passed through a field, this phenomenon is not a problem since the tags are moved through the field and only resides in one of these no energy regions for a very brief period of time. Likewise, when the interrogator or interrogator's antenna is mobile, the field is then moved about the tags so these no energy regions are moved around the tags.

SUMMARY

RFID tags are used for many purpose including tracking RFID interrogators are used to retrieve information from tags. In many applications, RFID interrogators and RFID tags remain stationary during interrogation. Regions of low energy due to interference from either additional antenna or reflections from RFID tags and objects can impede or prohibit the reading of RFID tags residing in such regions. Stirring of the generated electromagnetic field is a method of moving around the regions of low energy, where tags can not be read, during the interrogation process. Mechanical stirring is accomplished by introducing a conductor into the electromagnetic field and moving it about in the field. Solid state storing is accomplished by introducing a variable conductor into the field and varying the conductivity of the variable conductor. Mathematical stirring is accomplished by use of a plurality of antenna and controlling the phase difference between the antenna in a configuration known as phased antenna arrays.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION

It is well known in the electrical engineering arts that the introduction of a conductor to an electric field alters the field provided it is of a length greater than the wavelength of the field. Also, the change of position of the conductor also changes the electromagnetic field. In particular, the location of low energy regions resulting from destructive interference can be moved, spatially. The method of moving the low energy regions of an electromagnetic field by the use of conductors is referred to as stirring.

Figure 1:
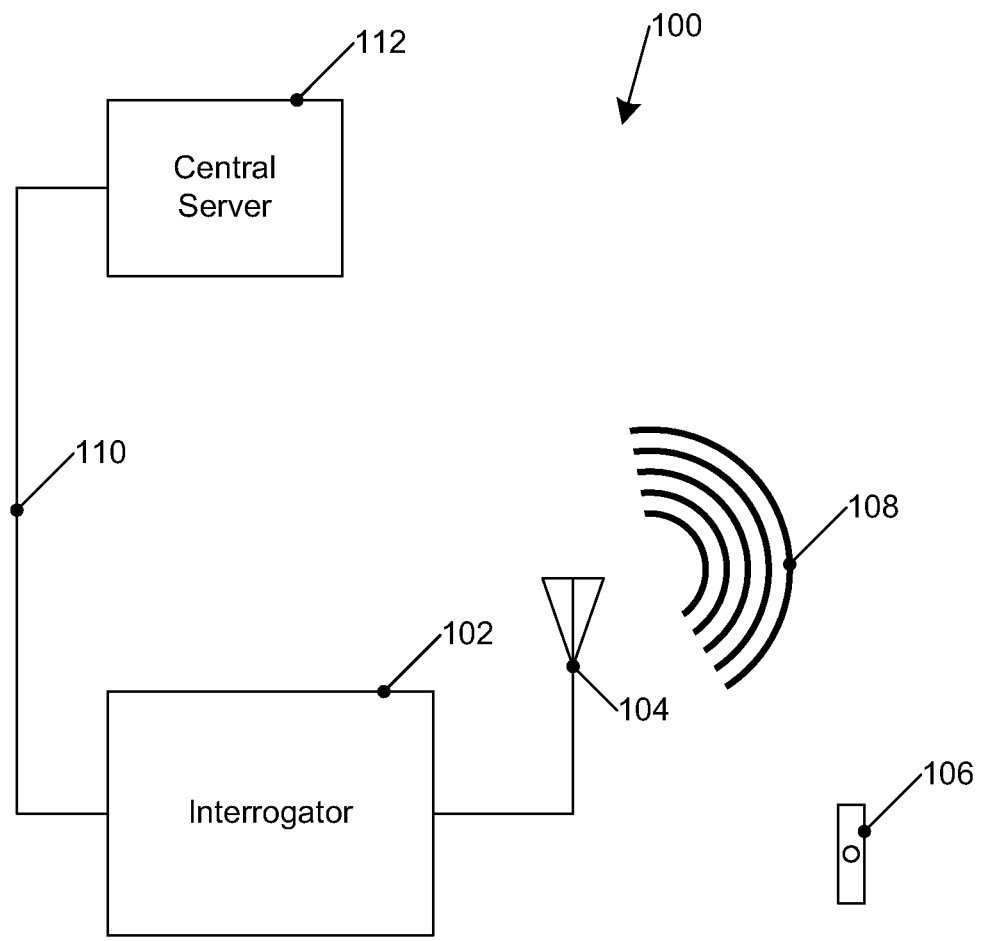
FIG. 1 illustrates a basic RFID system.
Figure 2:
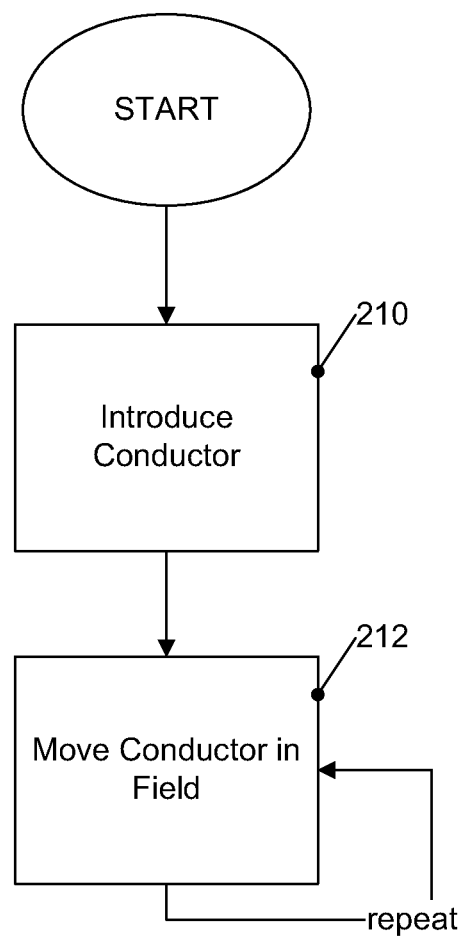
FIG. 2 depicts a method of stirring an electromagnetic field by moving a conductor in the electromagnetic field.

FIG. 2 depicts a mechanical method of stirring an electromagnetic field. A conductor IS introduced into the electromagnetic interrogation field at step 210. As the interrogation zone is interrogated, the conductor is then set in motion at step 212. In one embodiment, the conductor is only in motion while the RFID tags are being interrogated. In another embodiment, the conductor is in motion the entire time the system is in operation. The motion of the conductor can be significant that is the distance traversed is many times that of the wavelength. For simplicity, the motion can be a repeatable periodic pattern, such as rotation or oscillation.

Figure 3:
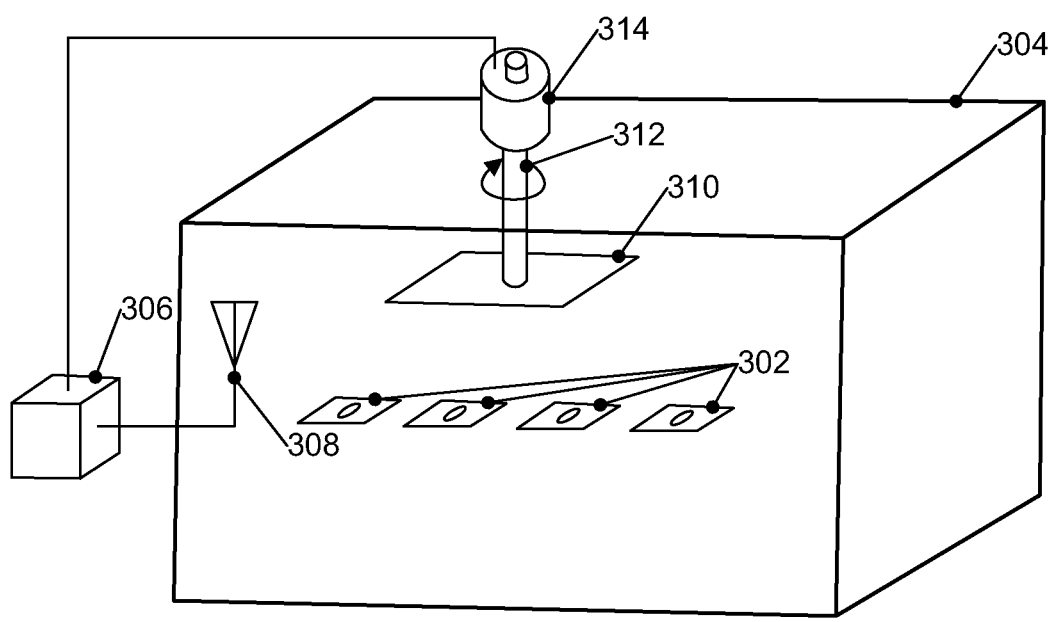
FIG. 3 illustrates a system implementing the method of stirring described in FIG. 2.

FIG. 3 illustrates a system implementing the mechanical method of stirring described in FIG. 2. In an embodiment, the RFID tags 302 are enclosed inside a structure 304. Interrogator 306 can reside outside structure 304, but antenna 308 can reside inside the structure to perform the interrogation. Conductor 310 can also reside inside structure 304. In an embodiment, conductor 310 comprises and is coupled to shaft 312 that drives it in a rotational manner. The conductor 310 can be, for example, a piece of metal. Shaft 312 is coupled to a rotational mechanism 314, such as a motor, outside of the structure 304, which can be coupled to interrogator 306 so that the rotation occurs only when interrogation takes place or only when the interrogation system is active.

Figure 4:
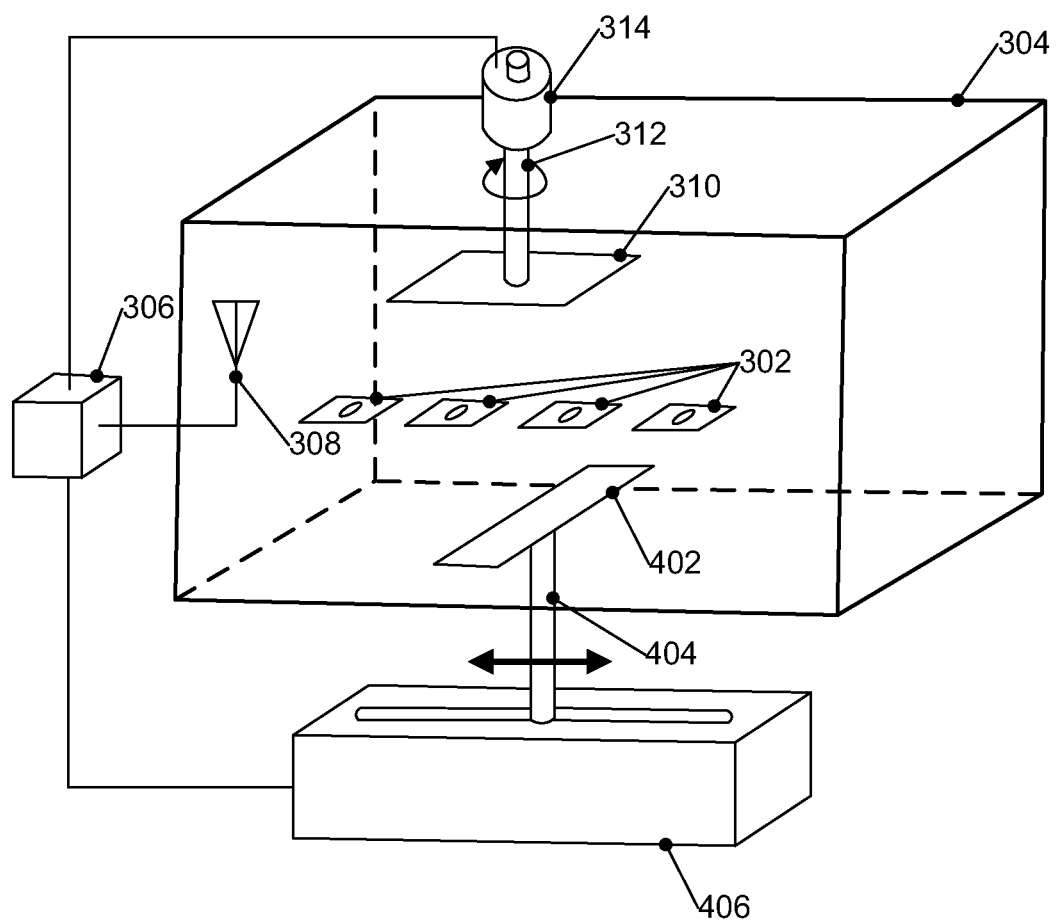
FIG. 4 illustrates another embodiment of a system implementing stirring with an additional conductor.

FIG. 4 illustrates another embodiment of a system implementing stirring with an additional conductor 402 which can, for example, be a piece of metal. It is coupled to a shaft 404 which can be coupled to an oscillatory mechanism 406 which can be coupled to interrogator 306. The depiction of oscillatory mechanism 406 rather than a rotational mechanism is presented to illustrate the variety of motion mechanisms which can be employed to move the conductors within the electromagnetic interrogation field. The motion of conductor 402 can be arbitrary, but a more diverse stirring can be accomplished if the motion of conductor 310 and conductor 402 are independent.

In another embodiment of the above described system, the conductors are placed outside the portion of the structure housing the RFID tagged objects. In such an embodiment, the antenna and conductor(s) can be built into the door or walls of the structure or deployed external to the structure. In additional embodiments, additional conductors with motion independent of the other moving conductors in the system leads to more diverse stirring of the low energy region of the electromagnetic interrogation field.

A solid state alternative to the described mechanical stirring of an electromagnetic field is the use of a material of variable conductivity. A material that changes from an insulator to a conductor can alter an electromagnetic field and in particular spatially move the low energy region of an interrogation signal.

Figure 5:
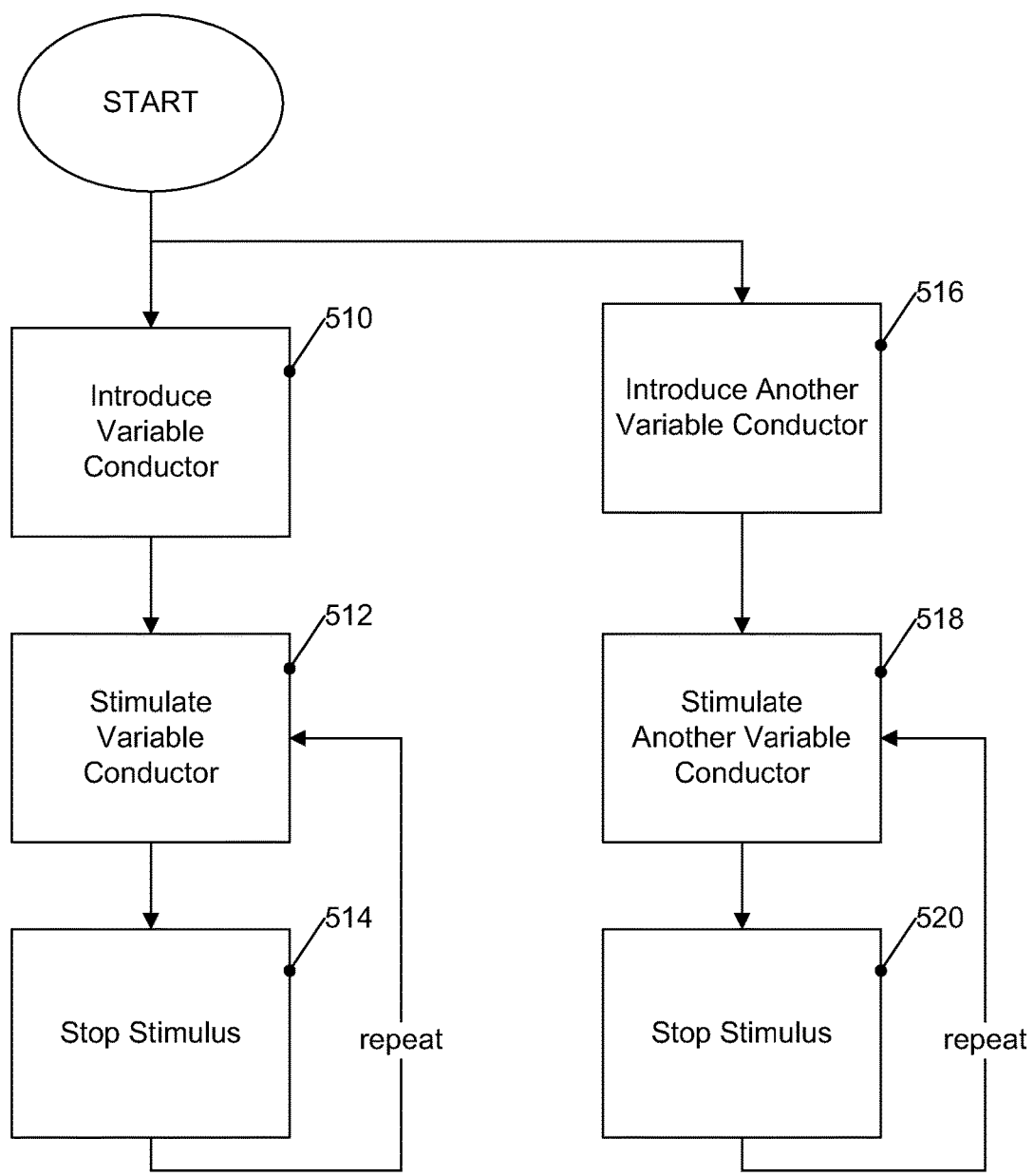
FIG. 5 depicts a method of stirring an electromagnetic field using a variable conductor in the electromagnetic field.

FIG. 5 depicts a solid state method of stirring an electromagnetic field. A variable conductor is introduced into the electromagnetic interrogation field at step 510. The variable conductor can be of a length greater than the wavelength of the electromagnetic field. Examples of variable conductors include a pin-diode (p-type intrinsic, n-type diode) which becomes a conductor when a voltage is applied to it, a photoconductor which becomes a conductor when exposed to light, or a piezoconductor which becomes a conductor when exposed to vibration or mechanical stress. As the interrogation zone is interrogated, the appropriate stimulus is applied to the variable conductor at step 512 to make it a conductor, such as applying a voltage to a pin-diode or a light to a photoconductor. During the interrogation process, the stimulus is removed (step 514) and reapplied (step 512) in order to keep the low energy region of the field in motion so that no RFID tag will reside within a low energy region throughout the interrogation process. In another embodiment of the method a second variable conductor is introduced into the electromagnetic interrogation field at step 516 and as the interrogation zone is interrogated, the appropriate stimulus is applied (step 518) and removed (step 520) throughout the interrogation process. The pattern of the stimuli applied to both variable conductors can be independent, leading to a more diverse movement of the low energy region of the interrogating electromagnetic field.

Figure 6:
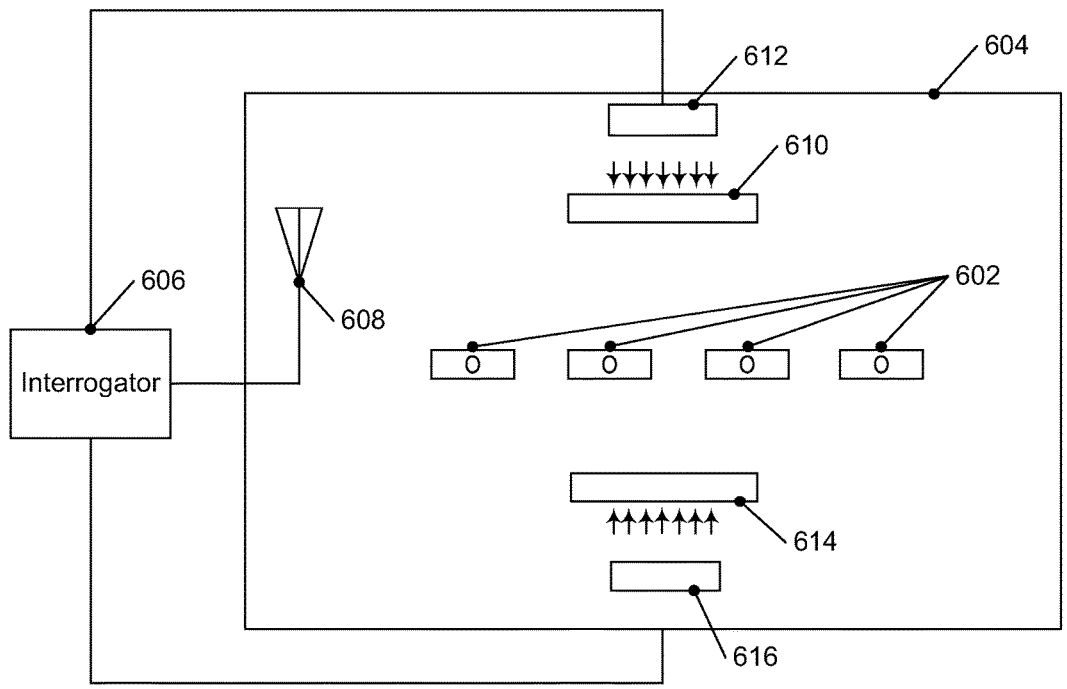
FIG. 6 depicts a system implementing the solid state stirring of an electromagnetic field during the interrogation of RFID tags.

FIG. 6 depicts a system implementing the solid state stirring of an electromagnetic field during the interrogation of RFID tags. RFID tags 602 attached to tagged objects reside inside structure 604. Interrogator 606 can reside external to structure 604. In another embodiment, it can reside internal to or as part of the wall of the structure. Antenna 608, which is coupled to interrogator 606 resides inside the structure, but in other embodiments can reside as part of the wall or just external to the structure. Variable conductor 610 can be placed inside structure 604 coupled to stimulus 612. In the case of a pin-diode, the stimulus can be a electrical potential wired to the pin-diode. In the case of a photoconductor, the stimulus can be a optical fiber, light emitting diode, or semiconductor laser mounted near the photoconductor. The stimulus 612 can be coupled to the interrogator 606 or can be independent of the interrogator 606.

In another embodiment of the system, another variable conductor 614 can be placed inside structure 604, coupled to stimulus 616. Variable conductors 610 and 614 can be of similar or differing types, for example two pin-diodes or a pin-diode and a photoconductor. Stimuli 612 and 616 can be independent in their operation leading to a more diverse movement of the low energy region of the electromagnetic interrogation field.

In additional embodiments, additional variable conductors operating independently of the other variable conductors in the system leads to more diverse stirring of the low energy region of the electromagnetic interrogation field.

Another method of shifting the position of low energy regions as well as high energy regions is by employing one or more additional antenna, where all antenna connected to the interrogator are coupled together with a varying phase shift. This technique is referred to as phased arraying of antennae. By varying the phase shift between the antennae the high and low energy regions of the electromagnetic fields are shifted throughout the interrogation zone, thereby interrogating all RFID tags in the target region.

Figure 7:
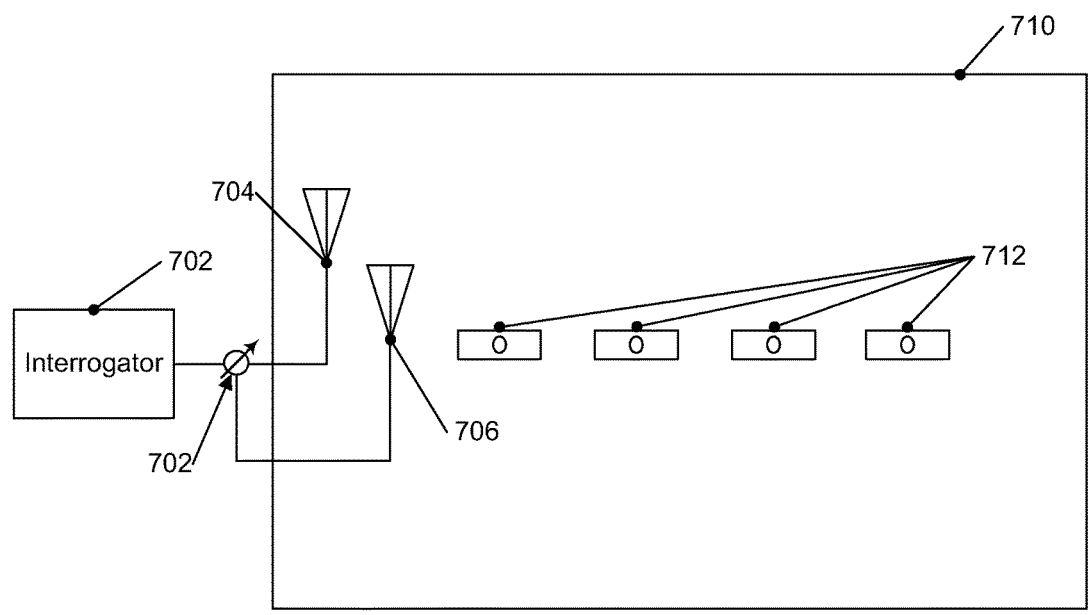
FIG. 7 shows a system employed a phased antenna array.

FIG. 7 shows a system employing a phased antenna array. Interrogator 702 is coupled to antennae 704 and 706. Antennae 704 and 706 are linked by phase shifter 708, which can be controlled by interrogator 702. Antennae 704 and 706 can be mounted just external to, inside the walls of, or internal to the enclosing structure 710 as depicted in FIG. 7. Phase shifter 708 varies the phase difference between antennae 704 and 706 so that the field can scan the entire enclosing structure 710. Specific prescription for the shifting of phases to control the placement of the high and low energy regions is well known in, the art of radio frequency engineering.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A method for interrogating one or more stationary RFID tags in a static interrogation environment, the method comprising:
   providing a stationary antenna for transmitting and receiving RF signals to and from the one or more stationary RFID tags;
   generating, by the stationary antenna, an electromagnetic interrogation field of a predetermined frequency in the interrogation environment; and
   moving a first conductor positioned inside the electromagnetic interrogation field while both the stationary antenna and the one or more stationary RFID tags are stationary, wherein moving the first conductor varies a position of at least one low energy region present within the electromagnetic interrogation field.

2. The method of claim 1, wherein the first conductor is moved continuously with respect to the one or more stationary RFID tags in the interrogation environment.

3. The method of claim 1, wherein the first conductor is rotated with respect to the one or more stationary RFID tags in the interrogation environment.

4. The method of claim 1, wherein the conductor comprises a piece of metal having a length greater than a wavelength of the electromagnetic field.

5. The method of claim 1, wherein the interrogation environment comprises an enclosed structure.

6. The method of claim 1, wherein the stationary antenna and the first conductor are coupled to an interrogator, and wherein the interrogator is coupled to a network that is further coupled to a central server.

7. The method of claim 1, the first conductor is oscillated with respect to the one or more stationary RFID tags in the interrogation environment.

8. The method of claim 1, wherein the position of the at least one low energy region present within the electromagnetic interrogation field is further varied by moving a second conductor separate from the stationary antenna.

9. The method of claim 8, wherein a motion of the first conductor is independent of a motion of the second conductor.

10. The method of claim 8, wherein a motion of at least one of the first conductor and the second conductor is arbitrary.

11. The method of claim 8, wherein one of the first conductor and the second conductor is rotated and the other of the first conductor and the second conductor is oscillated with respect to the one or more stationary RFID tags in the interrogation environment.

12. The method of claim 5, wherein the first conductor is external to the enclosed structure.

13. The method of claim 1, wherein the first conductor is in motion only when the one or more stationary RFID tags are being interrogated.

14. The method of claim 1, wherein the first conductor is in motion entire time when an RFID interrogation system including the stationary antenna, the one or more stationary RFID tags, and a RFID interrogator is active.

* * * * *